(12) United States Patent
Seler et al.

(10) Patent No.: US 11,854,917 B2
(45) Date of Patent: Dec. 26, 2023

(54) RADIO-FREQUENCY DEVICE COMPRISING SEMICONDUCTOR DEVICE AND WAVEGUIDE COMPONENT

(71) Applicant: Infineon Technologies AG, Neubiberg (DE)

(72) Inventors: Ernst Seler, Munich (DE); Ulrich Moeller, Holzkirchen (DE); Bernhard Rieder, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 419 days.

(21) Appl. No.: 17/248,262

(22) Filed: Jan. 15, 2021

(65) Prior Publication Data

US 2021/0225719 A1 Jul. 22, 2021

(30) Foreign Application Priority Data

Jan. 21, 2020 (DE) .......................... 102020101293.4

(51) Int. Cl.
*H01L 23/10* (2006.01)
*H01L 23/66* (2006.01)
(Continued)

(52) U.S. Cl.
CPC .......... *H01L 23/10* (2013.01); *H01L 21/4803* (2013.01); *H01L 21/4817* (2013.01);
(Continued)

(58) Field of Classification Search
CPC . H01L 21/4803; H01L 21/4817; H01L 23/04; H01L 23/053; H01L 23/10; H01L 23/24; H01L 23/49816; H01L 23/49833; H01L 23/66; H01L 24/16; H01L 24/17; H01L 24/20; H01L 24/32; H01L 24/33; H01L 24/69; H01L 24/70; H01L 24/73; H01L 2223/6627; H01L 2223/6683; H01L 2224/04105; H01L 2224/12105; H01L 2224/16227; H01L 2224/32225;
(Continued)

(56) References Cited

U.S. PATENT DOCUMENTS 5,668,509 A 9/1997 Hoffmeister et al.
5,770,981 A 6/1998 Koizumi et al.
(Continued)

FOREIGN PATENT DOCUMENTS

DE 102015112861 A1 2/2016

OTHER PUBLICATIONS

R&D Interconnect Solutions., "Invisipin Board to Board," Specification Sheet, 2019, 2 pages.

*Primary Examiner* — Cheung Lee
(74) *Attorney, Agent, or Firm* — Harrity & Harrity, LLP

(57) ABSTRACT

A radio-frequency device comprises a semiconductor device, comprising a radio-frequency chip, and a first connection element, which is configured to mechanically and electrically connect the semiconductor device to a circuit board. The radio-frequency device furthermore comprises a waveguide component arranged over the semiconductor device, comprising a waveguide embodied in the waveguide component, and a second connection element, which mechanically connects the waveguide component to the semiconductor device. At least one from the first connection element or the second connection element is embodied in an elastic fashion.

20 Claims, 5 Drawing Sheets

(51) Int. Cl.
*H01L 23/053* (2006.01)
*H01L 23/498* (2006.01)
*H01L 23/24* (2006.01)
*H01L 21/48* (2006.01)
*H01Q 9/04* (2006.01)

(52) U.S. Cl.
CPC ............ *H01L 23/053* (2013.01); *H01L 23/24* (2013.01); *H01L 23/49816* (2013.01); *H01L 23/49833* (2013.01); *H01L 23/66* (2013.01); *H01Q 9/0407* (2013.01); *H01L 2223/6677* (2013.01)

(58) Field of Classification Search
CPC ... H01L 2224/73204; H01L 2924/1421; H01L 2924/1423; H01L 2924/15321; H01L 2924/351; H01Q 1/2283; H01Q 9/0407
See application file for complete search history.

(56) References Cited

U.S. PATENT DOCUMENTS

2002/0044033 A1  4/2002  Tamaki
2011/0163919 A1  7/2011  Suzuki

RADIO-FREQUENCY DEVICE COMPRISING
SEMICONDUCTOR DEVICE AND
WAVEGUIDE COMPONENT

CROSS REFERENCE TO RELATED APPLICATION

This application claims priority to German Patent Application No. 102020101293.4 filed on Jan. 21, 2020, the content of which is incorporated by reference herein in its entirety.

TECHNICAL FIELD

The present disclosure relates generally to RF (radio-frequency) technology. For example, the present disclosure relates to RF devices comprising a semiconductor device and a waveguide component, and to methods for manufacturing such RF devices.

BACKGROUND

RF devices can be used in automotive safety applications, for example. By way of example, radar sensors can be used for blind spot detection, automated speed regulation, collision avoidance systems, etc. In radar applications, the signal routing and redistribution between chip and antenna may be critical parameters with regard to the electromagnetic performance and cost-effectiveness of the application. Radar applications may have for example air-filled hollow waveguides for signal routing.

BRIEF SUMMARY

Various aspects relate to a radio-frequency device. The radio-frequency device comprises a semiconductor device. The semiconductor device comprises a radio-frequency chip, and a first connection element, which is configured to mechanically and electrically connect the semiconductor device to a circuit board. The radio-frequency device furthermore comprises a waveguide component arranged over the semiconductor device. The waveguide component comprises a waveguide embodied in the waveguide component, and a second connection element, which mechanically connects the waveguide component to the semiconductor device. At least one from the first connection element or the second connection element is an elastic connection element (embodied in an elastic fashion).

Various aspects relate to a radio-frequency device. The radio-frequency device comprises a semiconductor device. The semiconductor device comprises a radio-frequency chip, and a first connection element, which is configured to mechanically and electrically connect the semiconductor device to a circuit board. The radio-frequency device furthermore comprises a waveguide component arranged over the semiconductor device. The waveguide component comprises a waveguide embodied in the waveguide component, and a second connection element, which mechanically connects the waveguide component to the semiconductor device. The radio-frequency device furthermore comprises a spacer. The spacer has a higher melting point than the first connection element. The spacer and the first connection element are arranged on an identical surface of the semiconductor device. The spacer is configured to provide a constant distance between the semiconductor device and a circuit board upon the semiconductor device being mechanically connected to the circuit board.

Various aspects relate to a radio-frequency device. The radio-frequency device comprises a semiconductor device. The semiconductor device comprises a radio-frequency chip, and a rigid first connection element. The radio-frequency device furthermore comprises a waveguide component arranged over the semiconductor device. The waveguide component comprises a waveguide embodied in the waveguide component, and a second connection element, which mechanically connects the waveguide component to the semiconductor device. The rigid first connection element is configured to mechanically and electrically connect the radio-frequency device to a circuit board, such that there is no direct mechanical contact between the circuit board and the waveguide component.

Various aspects relate to a method for manufacturing a radio-frequency device. The method comprises producing a semiconductor device. The semiconductor device comprises a radio-frequency chip, and a first connection element, which is configured to mechanically and electrically connect the semiconductor device to a circuit board. The method furthermore comprises mechanically connecting a waveguide component to the semiconductor device using a second connection element, wherein the waveguide component comprises a waveguide embodied in the waveguide component. At least one from the first connection element or the second connection element is an elastic connection element.

Various aspects relate to a method for manufacturing a radio-frequency device. The method comprises producing a semiconductor device. The semiconductor device comprises a radio-frequency chip, and a first connection element on a surface of the semiconductor device, wherein the first connection element is configured to mechanically and electrically connect the semiconductor device to a circuit board. The method furthermore comprises mechanically connecting a waveguide component to the semiconductor device using a second connection element, wherein the waveguide component comprises a waveguide embodied in the waveguide component. The method furthermore comprises arranging a spacer on the surface of the semiconductor device. The spacer has a higher melting point than the first connection element. The spacer is configured to provide a constant distance between the semiconductor device and a circuit board upon the semiconductor device being mechanically connected to the circuit board.

DETAILED DESCRIPTION

In the following detailed description, reference is made to the accompanying drawings, which show for illustration purposes specific aspects and implementations in which the disclosure can be implemented in practice. In this context, direction terms such as, for example, "at the top", "at the bottom", "at the front", "at the back" etc. can be used with respect to the orientation of the figures described. Since the components of the implementations described can be positioned in different orientations, the direction terms can be used for illustration purposes and are not restrictive in any way whatsoever. Other aspects can be used and structural or logical changes can be made, without departing from the concept of the present disclosure. In other words, the following detailed description should not be understood in a restrictive sense.

Schematic views of RF devices in accordance with the disclosure are described below. In this case, the RF devices can be illustrated in a general way in order to describe aspects of the disclosure qualitatively. The RF devices can in each case have further aspects that are not illustrated in the figures for the sake of simplicity. For example, the respective RF devices can be extended by any aspects described in association with other devices or methods in accordance with the disclosure.

Figure 1:
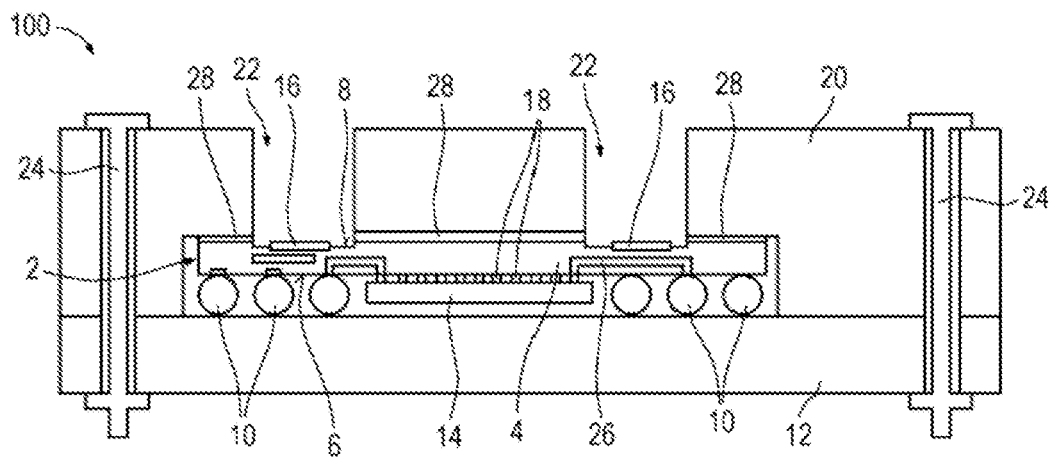
FIG. 1 schematically shows a cross-sectional side view of an RF device 100 in accordance with the disclosure.

FIG. 1 schematically shows a cross-sectional side view of an RF device 100 in accordance with the disclosure. The RF device 100 can comprise a semiconductor device 2. The semiconductor device 2 can comprise a substrate 4 having a first surface 6 and a second surface 8 situated opposite the first surface 6. The semiconductor device 2 can furthermore comprise at least one first connection element 10 which is arranged on the first surface 6 of the substrate 4 and which can be configured to electrically and mechanically connect the semiconductor device 2 to a circuit board 12. Six first connection elements 10 are shown by way of example in FIG. 1. In further examples, the number of first connection elements 10 can deviate therefrom, in particular can be greater. The circuit board 12 may or may not be regarded as part of the RF device 100. The semiconductor device 2 can furthermore comprise an RF semiconductor chip (e.g., RF chip 14) arranged on the first surface 6 of the substrate 4. One or more radiation elements 16 can be arranged on the second surface 8 of the substrate 4.

The substrate 4 can be a ball grid array (BGA) substrate, in particular. Furthermore, the RF chip 14 can be electrically and mechanically connected to the substrate 4 by way of connecting elements 18 in particular using a flip-chip technique. The RF chip 14 can thus be mounted directly with an active contacting side downward toward the substrate 4 without additional connecting wires. The substrate 4 and the RF chip 14 can thus form in particular a flip-chip ball grid array (FCBGA). The semiconductor device 2 shown in FIG. 1 can be regarded as by way of example. An RF device in accordance with the disclosure having a semiconductor device of a different type is shown and described in FIG. 5.

The substrate 4 can comprise one or more layers composed of a ceramic or dielectric material. Structures 26 for carrying and/or redistributing electrical signals can be embedded into the layers. These signal-carrying structures 26 can comprise through contacts and conductor tracks. The conductor tracks can be arranged between the ceramic or dielectric layers on different planes and can be electrically connected to one another via through contacts extending substantially vertically. In this case, the through contacts can extend partly, but not necessary completely, through the substrate 4. The signal-carrying structures 26 can be configured in particular to electrically couple the RF chip 14 and the at least one first connecting element 10. Furthermore, the signal-carrying structures 26 can be configured very generally to establish electric connections between electrical contact pads that can be arranged on the first surface 6 and the second surface 8 of the substrate 4.

The RF chip 14 can comprise or correspond to a monolithic microwave integrated circuit (MMIC), in particular. The RF chip 14 can operate in various frequency ranges. Accordingly, the radiation elements 16 electrically coupled to the RF chip 14 can be configured to emit and/or to receive signals having frequencies in the frequency ranges. In one example, the RF chip 14 can operate in a radio-frequency or microwave frequency range that can generally range from approximately 10 GHz to approximately 300 GHz. By way of example, accordingly, circuits integrated into the RF chip 14 can operate in a frequency range of greater than approximately 10 GHz, and the radiation elements 16 can emit and/or receive signals having a frequency of greater than approximately 10 GHz. Microwave circuits of this type can comprise for example microwave transmitters, microwave receivers, microwave transceivers, microwave sensors, or microwave detectors. The RF devices described herein can be used for example for radar applications in which the frequency of the RF signal can be modulated. Radar microwave devices can be used for example in automotive or industrial applications for distance determining/distance measuring systems. By way of example, automatic vehicle speed regulating systems or vehicle anticollision systems can operate in the microwave frequency range, for example in the 24 GHz, 77 GHz or 79 GHz frequency bands.

Alternatively or additionally, the RF chip 14 can operate in a Bluetooth frequency range. Such a frequency range can comprise for example an ISM (Industrial, Scientific and Medical) band between approximately 2.402 GHz and approximately 2.480 GHz. The RF chip 14 or circuits integrated into the RF chip 14 can accordingly more generally be configured to operate in a frequency range of greater than approximately 1 GHz, and the radiation elements 16 can accordingly be configured to emit and/or to receive signals having a frequency of greater than approximately 1 GHz.

In one example, the RF chip 14 can be a "bare die", e.g. an unpackaged semiconductor chip. In a further example, the RF chip 14 can be a semiconductor package, e.g. a packaged semiconductor chip, for example a CSP (Chip Scale Package). By way of example, an encapsulation material can be arranged over the first surface 6 of the substrate 4, and can at least partly encapsulate the RF chip 14. The RF chip 14 can be protected against external influences, such as moisture, for example, by the encapsulation material. The encapsulation material can include for example at least one from a mold compound, a laminate, an epoxy, a filled epoxy, a glass-fiber-filled epoxy, an imide, a thermoplastic, a thermosetting polymer, a polymer mixture.

The RF device 100 can comprise a waveguide component 20 having one or more waveguides 22. The waveguide component 20 can be mechanically connected (in particular directly) to the circuit board 12 by way of mechanical connection elements 24. In this case, the waveguide component 20 can extend over the second surface 8 and side surfaces of the semiconductor device 2 or of the substrate 4 and thereby at least partly cover or encapsulate the semiconductor device 2. In the example in FIG. 1, the waveguide component 20 can be mechanically connected directly to the circuit board 12 using screws as mechanical connection elements 24. Alternatively or additionally, in further examples, a mechanical connection can be provided using one or more from an adhesive, a solder material, a clamp, a clip, etc.

Each of the radiation elements 16 can be configured to feed or radiate RF signals generated by the RF chip 14 and guided to the radiation element 16 into the corresponding waveguide 22. Alternatively or additionally, the radiation element 16 can be configured to receive RF signals radiated into the corresponding waveguide 22 from outside the RF device 100, which signals can then be forwarded to the RF chip 14. In the context described, the radiation element 16 can also be referred to as a "waveguide feed". An electrical connection between the radiation element 16 and the RF chip 14 can be provided for example by a coaxial connection extending substantially vertically.

The radiation element 16 can be embodied for example as an antenna in the form of a structured metal layer on the second surface 8 of the substrate 4. In this case, such an antenna does not necessarily emit uniformly into the space, but rather can be configured to feed the electromagnetic waves generated by it into the corresponding waveguide 22 in a suitable manner. One example implementation of such an antenna structure is shown and described in FIG. 9. The respective radiation element 16 can be arranged on the second surface 8 such that the radiation element 16 and the volume of the waveguide 22 arranged thereover at least partly overlap in an orthogonal projection onto the second surface 8 of the substrate 4.

The waveguide component 20 can be embodied integrally or comprise a multiplicity of parts. The waveguide component 20 can be fabricated from plastic, a ceramic material, and/or a dielectric material. In the example in FIG. 1, the waveguides 22 can be embodied in the form of hollow waveguides having metallized inner walls. In this case, it is possible for the hollow waveguides to be air- or gas-filled, in particular, e.g. not to contain any solid or any liquid. In other words, one or more of the waveguides 22 can be "material-free" hollow waveguides. Such hollow waveguides can be embodied for example as WR (Waveguide Rectangular) hollow waveguides, for example as WR10 or WR12 hollow waveguides. In further examples, the waveguides of RF devices in accordance with the disclosure can alternatively or additionally be embodied in the form of dielectric waveguides or hollow substrate integrated waveguides (SIWs).

The waveguide component 20 can be embodied in particular in a monolayer or multilayered injection-molded plastic. The at least one waveguide 22 can comprise a metallized hollow waveguide embodied in the injection-molded plastic. Only hollow waveguides extending vertically through the waveguide component 20 are illustrated in the example in FIG. 1. In further examples, the waveguide component 20 can comprise any desired combination of interconnected hollow waveguide sections, which can extend in particular horizontally and/or vertically. One example implementation of a horizontal hollow waveguide in a multilayered injection-molded plastic is shown and described in FIG. 10. A combination of interconnected horizontal and vertical hollow waveguide sections is shown and described in FIG. 4.

The waveguide component 20 can be mechanically connected to the semiconductor device 2 by one or more second connection elements 28. In this case, a top side of the respective connection element 28 can mechanically contact (in particular directly) an underside of the waveguide component 20, and/or an underside of the connection element 28 can mechanically contact (in particular directly) a top side of the semiconductor device 2. On account of the direct mechanical contact possible, an air gap need not necessarily be formed between the top side of the semiconductor device 2 and the underside of the waveguide component 20. Avoiding such an air gap makes it possible to prevent or at least reduce crosstalk between RF signals transmitted in adjacent waveguides 22.

The mechanical connection between the semiconductor device 2 and the waveguide component 20 can be effected with a high accuracy. Before the mechanical connection, the waveguide component 20 can be aligned with the semiconductor device 2 using one or more optical alignment structures and/or one or more mechanical alignment structures. The optical alignment structures can be optical markings, for example, which can be arranged on the semiconductor device 2 and/or the waveguide component 20. The mechanical alignment structures can be pins or notches for mechanical guidance, for example, which can likewise be arranged on the semiconductor device 2 and/or the waveguide component 20. The accurate mechanical connection makes it possible to provide a precise alignment of the respective radiation element 16 with the waveguide 22 assigned thereto. As a result, the radiation element 16 can radiate into the waveguide 22 and/or receive signals by way of the waveguide 22 optimally and with little power loss. The overall performance of the RF device 100 can thus be improved in comparison with conventional RF devices.

On account of the mechanical connections between the waveguide component 20 and the circuit board 12, between the waveguide component 20 and the semiconductor device 2, and between the semiconductor device 2 and the circuit board 12, mechanical stresses can occur during manufacture and/or operation of the RF device 100. In particular, the mechanical stresses can result in mechanical loading of the first connection elements 10 and in the worst case can result in the connection elements breaking. In order to avoid these mechanical stresses, at least one from the first connection element 10 or the second connection element 28 can be embodied in an elastic fashion. In the case of an elastic first connection element 10, it is possible to provide mechanical stress reduction on the underside of the semiconductor device 2. In this case, in particular all of the first connection elements 10 can be embodied in an elastic fashion. In a similar way, an elastic second connection element 28 makes it possible to provide mechanical stress reduction on the top side of the semiconductor device 2. In this case, in particular all of the second connection elements 28 can be embodied in an elastic fashion.

A material (or bulk material) or a connection element fabricated from the material can be referred to as "rigid" if its Young's modulus (or modulus of elasticity or E-modulus) is greater than approximately 5 GPa, more precisely greater than approximately 10 GPa, more precisely greater than approximately 15 GPa, or more precisely greater than approximately 20 GPa. A material (or bulk material) can be referred to as "elastic" if its Young's modulus is less than approximately 5 GPa, more precisely less than approximately 4 GPa, more precisely less than approximately 3 GPa, more precisely less than approximately 2 GPa, more precisely less than approximately 1 GPa, or more precisely less than approximately 0.5 GPa. An elastomer or rubber can have a Young's modulus of approximately 0.01 GPa to approximately 0.1 GPa. A polymer (e.g. PC, PTFE, PET) can have a Young's modulus of approximately 0.5 GPa to approximately 5 GPa. A mold compound can have a Young's modulus of approximately 18 GPa to approximately 22 GPa. A solder material (e.g. SAC305) can have a Young's modulus of approximately 30 GPa to approximately 50 GPa. A metal can have a Young's modulus of approximately 50 GPa to approximately 200 GPa. A single-crystal silicon can have a Young's modulus of approximately 130 GPa to approximately 185 GPa.

The first connection element 10 can be electrically conductive. By way of example, an elastic first connection element 10 can comprise an elastic plastic with electrically conductive filler particles. The elastic plastic can be an elastomer. The electrically conductive filler particles can consist of a metal or a metal alloy. An elastic first connection element 10 can comprise one or more from an elastomer pin, an elastomer ball, a spring element, or a foam. A rigid first connection element 10 can comprise one or more from a solder material, a metal, or a metal alloy. In one example, the rigid first connection element 10 can be a solder deposit, for example in the form of a ball, a column, a cube, or a parallelepiped. In a further example, a rigid first connection element 10 can be embodied in a columnar fashion and can be fabricated from copper or a copper alloy, for example.

The second connection element 28 can be electrically conductive or electrically insulating. An elastic second connection element 28 can comprise one or more from an elastomer or a foam. A rigid second connection element 28 can comprise one or more from a solder material, a metal, a metal alloy, or an adhesive.

In one example, one from the first connection element 10 or the second connection element 28 can be embodied in an elastic fashion, and the other connection element can be embodied in a rigid fashion. In this case, in particular all of the first connection elements 10 can be embodied in an elastic fashion and all of the second connection elements 28 can be embodied in a rigid fashion, or all of the first connection elements 10 can be embodied in a rigid fashion and all of the second connection elements 28 can be embodied in an elastic fashion. In a further example, both the first connection element 10 and the second connection element 28 can be embodied in an elastic fashion. In this case, in particular all of the first connection elements 10 and all of the second connection elements 28 can be embodied in an elastic fashion.

The RF device 100 can optionally comprise a heat-conducting element (not illustrated) arranged between the semiconductor device 2 or the RF chip 14 and the circuit board 12. In particular, the heat-conducting element can in this case mechanically contact the underside of the RF chip 14 and/or the top side of the circuit board 12. The heat-conducting element can be configured to reduce a thermal resistance between the RF chip 14 and the circuit board 12, such that heat generated by the RF chip 14 during operation of the RF device 100 can be dissipated in an improved way. For this purpose, the circuit board 12 can additionally be connected to a heat sink (not illustrated). The heat-conducting element can comprise for example one or more from a thermally conductive paste or a thermally conductive pad.

The RF device 100 can optionally comprise an underfill material (not illustrated). The underfill material can be arranged between the RF chip 14 and the substrate 4. Alternatively or additionally, an underfill material can be arranged between the RF chip 14 and the circuit board 12. By way of example, the underfill material can comprise one or more from an epoxy resin, a polymer, or a plastic. The underfill material can be configured to provide a mechanical stabilization between the semiconductor device 2 and the circuit board 12. Furthermore, the underfill material can be configured to reduce thermomechanical stresses that can result from different coefficients of thermal expansion of the RF chip 14 and of the circuit board 12.

Figure 2:
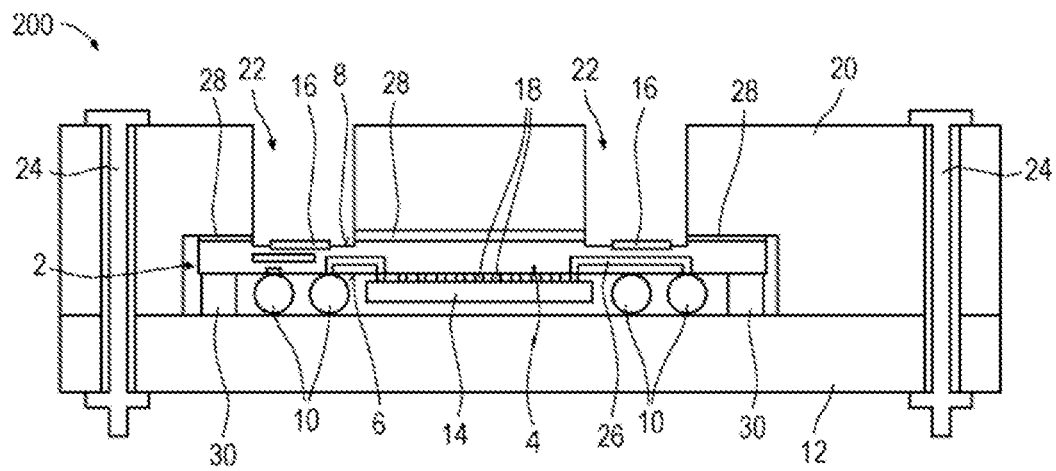
FIG. 2 schematically shows a cross-sectional side view of an RF device 200 in accordance with the disclosure.

FIG. 2 schematically shows a cross-sectional side view of an RF device 200 in accordance with the disclosure. The RF device 200 can be at least partly similar to the RF device 100 from FIG. 1 and can have similar components. Explanations concerning FIG. 1 can accordingly also apply to FIG. 2, and vice versa.

In contrast to FIG. 1, the RF device 200 can comprise one or more spacers 30. Two spacers 30 are shown in the example side view in FIG. 2. In other views or examples, the number of spacers 30 can deviate therefrom, in particular can be greater. The spacers 30 and the first connection elements 10 can be arranged on an identical first surface 6 of the semiconductor device 2 or of the substrate 4. In the example in FIG. 2, the spacers 30 can be arranged at the periphery of the substrate 4. In further examples, the spacers 30 can be arranged between first connection elements 10. The spacers 30 can be configured to provide a constant distance between the semiconductor device 2 and the circuit board 12 upon the semiconductor device 2 being mechanically connected to the circuit board 12. The spacers 30 can furthermore be configured to absorb mechanical stresses during the mechanical connection and/or during operation of the RF device 200, which stresses may otherwise affect the first connection elements 10. A function of the spacers 30 upon the semiconductor device 2 being mechanically connected to the circuit board 12 is described in association with FIG. 7.

The spacer 30 can comprise one or more from silicon, a plastic, or a mold compound. The spacer 30 can have a higher melting point than the first connection element 10. The melting point of the spacer 30 can be greater than approximately 300° C., more precisely greater than approximately 320° C., more precisely greater than approximately 340° C., more precisely greater than approximately 360° C., more precisely greater than approximately 380° C., more precisely greater than approximately 400° C. A difference between the melting point of the spacer 30 and the melting point of the first connection element 10 can be greater than approximately 80° C., more precisely greater than approximately 100° C., more precisely greater than approximately 120° C., more precisely greater than approximately 140° C., more precisely greater than approximately 160° C., more precisely greater than approximately 180° C.

Figure 3:
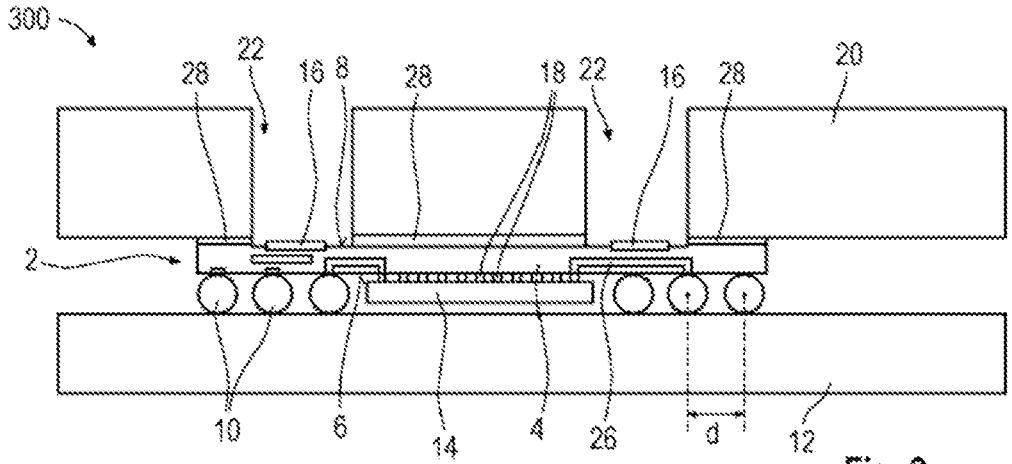
FIG. 3 schematically shows a cross-sectional side view of an RF device 300 in accordance with the disclosure.

FIG. 3 schematically shows a cross-sectional side view of an RF device 300 in accordance with the disclosure. The RF device 300 can be at least partly similar to the RF device 100 from FIG. 1 and can have similar components. Explanations concerning FIG. 1 can accordingly also apply to FIG. 3, and vice versa.

In contrast to FIG. 1, in the case of the RF device 300, there may be no direct mechanical contact between the waveguide component 20 and the circuit board 12. Accordingly, mechanical stresses that may arise as a result of a mechanical connection of the waveguide component 20 to the circuit board 12 need not necessarily occur in the RF device 300. In the example in FIG. 3, the first connection elements 10 can thus be embodied in a rigid fashion. Since there is no direct mechanical contact between the waveguide component 20 and the circuit board 12, the semiconductor device 2 can be regarded as a carrier for the waveguide component 20. The waveguide component 20 can be a comparatively small and light waveguide component. In particular, the waveguide component 20 can be embodied in an injection-molded plastic and the waveguide 22 can comprise a metallized hollow waveguide embodied in the injection-molded plastic.

The waveguide component 20 can extend over a surface of the semiconductor device 2 or of the substrate 4 that faces the waveguide component 20. In the example in FIG. 3, the underside of the waveguide component 20 and the top side of the semiconductor device 2 or of the substrate 4 can extend substantially parallel to one another. It is thus possible that the side surfaces of the semiconductor device 2 are not covered by the waveguide component 20. In further examples, the waveguide component 20 can at least partly cover the side surfaces of the semiconductor device 2, without making direct mechanical contact with the circuit board 12 in this case.

Rigid first connection elements 10 can provide a stable mechanical connection between the semiconductor device 2 and the circuit board 12. As a result, it is possible to choose a comparatively large distance "d" between adjacent first connection elements 10. In this case, the distance "d" can be measured between the centers of the adjacent first connection elements 10. By way of example, the distance "d" can be measured between the center points of solder balls, as illustrated in FIG. 3. The distance "d" can be greater than approximately 0.5 mm, more precisely greater than approximately 0.55 mm, more precisely greater than approximately 0.6 mm, more precisely greater than approximately 0.65 mm. The distance "d" can be defined as the minimum distance between (in particular all) adjacent first connection elements 10 of the RF device 300.

Figure 4:
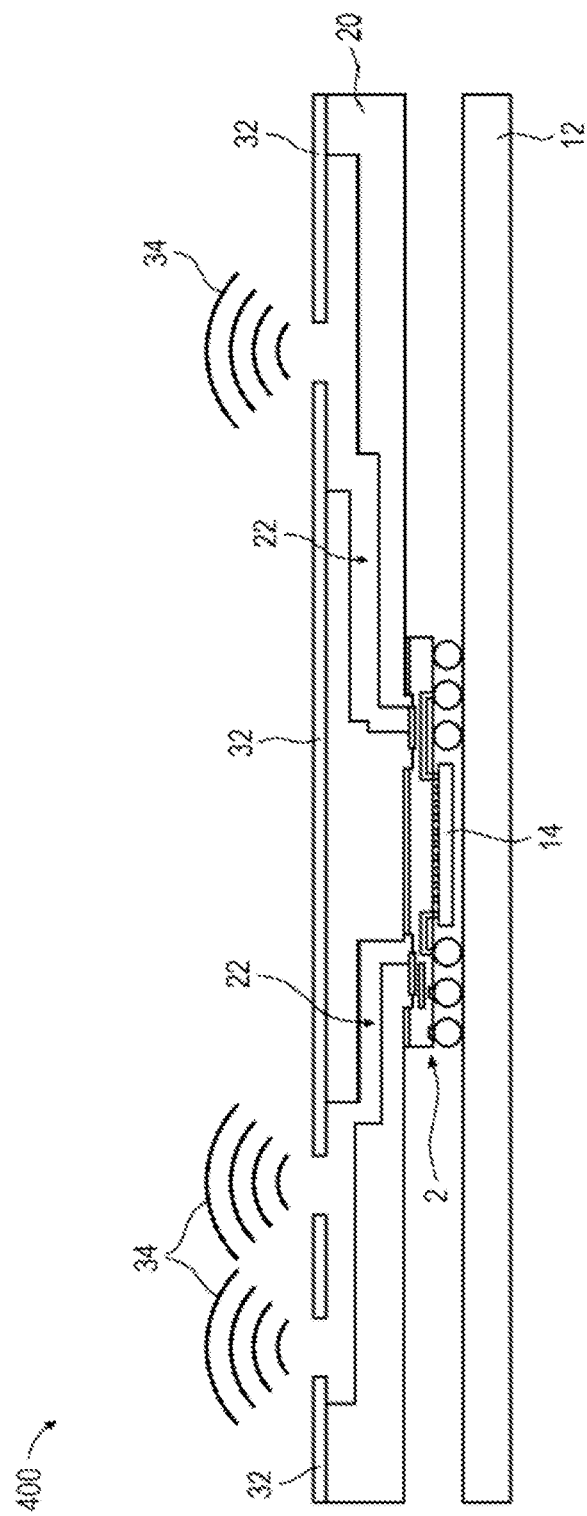
FIG. 4 schematically shows a cross-sectional side view of an RF device 400 in accordance with the disclosure.

FIG. 4 schematically shows a cross-sectional side view of an RF device 400 in accordance with the disclosure. The RF device 400 can be at least partly similar to the RF device 300 from FIG. 3 and can have similar components. Explanations concerning FIG. 3 can accordingly also apply to FIG. 4, and vice versa.

FIG. 4 shows a more comprehensive illustration of a waveguide component 20. In contrast to FIG. 3, the waveguide component 20 in FIG. 4 can comprise a plurality of interconnected horizontal and vertical waveguide sections. In the example in FIG. 4, each of the waveguides 22 can comprise two vertical and two horizontal hollow waveguide sections. A metal sheet 32 can be arranged on the top side of the waveguide component 20. The metal sheet 32 can be structured and comprise a plurality of patch antennas and/or slot antennas. The antennas can be transmitting and/or receiving antennas. Signals generated by the RF chip 14 and transferred via the waveguides 22 can be fed into the antennas of the metal sheet 32 and be emitted by the antennas. Emission of electromagnetic waves by the antennas is indicated by wavefronts 34 in FIG. 4. Alternatively or additionally, signals received by the antennas can be fed into the waveguides 22 and be forwarded to the RF chip 14. In the example in FIG. 4, the metal sheet 32 having antennas can be arranged on the top side of the waveguide component 20. Alternatively or additionally, a corresponding metal sheet can be arranged on the underside of the waveguide component 20.

Figure 5:
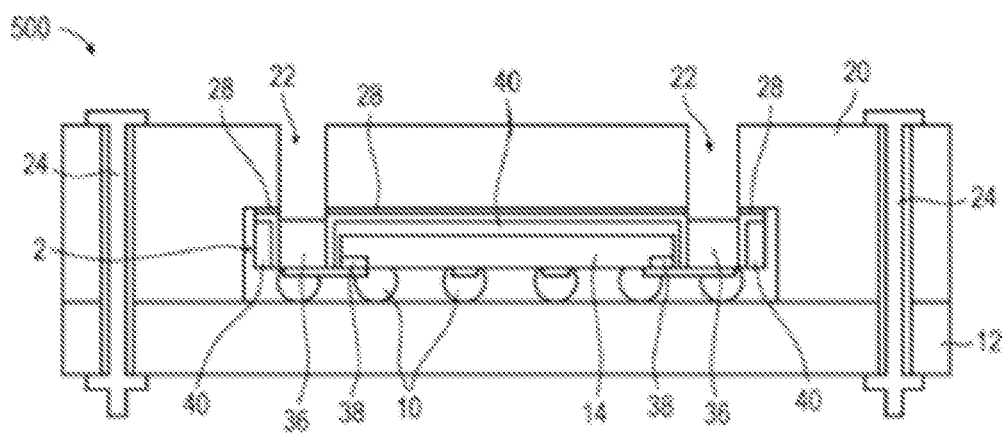
FIG. 5 schematically shows a cross-sectional side view of an RF device 500 in accordance with the disclosure.

FIG. 5 schematically shows a cross-sectional side view of an RF device 500 in accordance with the disclosure. The RF device 500 can be at least partly similar to the RF device 100 from FIG. 1 and can have similar components. Explanations concerning FIG. 1 can accordingly also apply to FIG. 5, and vice versa.

In contrast to FIG. 1, instead of the radiation elements 16 shown therein, the RF device 500 can comprise electrical interconnects 38 and waveguide transition elements 36 integrated into an encapsulation material 40. The respective waveguide transition element 36 can be configured to feed an RF signal generated by the RF chip 14 into the associated waveguide 22, and vice versa. The electrical interconnect 38 can be configured to electrically couple the waveguide transition element 36 to the RF chip 14.

The waveguide transition element 36 and the electrical interconnect 38 can be configured for example to convert a transverse electromagnetic mode (TEM mode) of the microwave transmission line forming the electrical interconnect 38 into a transverse electric mode (TE mode) of the waveguide 22. The waveguide 22 can be aligned with the waveguide transition element 36 in order to provide an effective coupling of a waveguide signal to the waveguide 22. If the waveguide transition element 36 operates as a transmitter, it may for example also be referred to as a launcher, for example a $TE_{01}$ launcher, if it is used to feed the $TE_{10}$ mode into the waveguide 22.

The waveguide transition element 36 can be partly or completely embedded into the encapsulation material 40. The waveguide transition element 36 can comprise at least one electrically conductive wall structure. In one example, the electrically conductive wall structure can be an "open structure", which can comprise for example one or more metallized via holes (not illustrated). If the waveguide 22 is embodied as a hollow waveguide, the metallized via holes may be regarded as a continuation of the hollow waveguide into the encapsulation material 40.

The electrical interconnect 38 can be partly or completely embedded into the encapsulation material 40. In one example, the electrical interconnect 38 can be embodied as or comprise a hollow waveguide integrated into the encapsulation material 40. In a further example, the electrical interconnect 38 can be embodied as an electrical redistribution layer, which can be arranged at a lower surface of the encapsulation material 40.

The RF chip 14 can be at least partly encapsulated by the encapsulation material 40. The encapsulation material 40 can include for example at least one from a mold compound, a laminate, an epoxy, a filled epoxy, a glass-fiber-filled epoxy, an imide, a thermoplastic, a thermosetting polymer, a polymer mixture. In comparison with FIG. 1, the semiconductor device 2 in FIG. 5 can be of a different type. The semiconductor device 2 in FIG. 5 can be for example a wafer level package, which can be manufactured for example in accordance with an eWLB (embedded Wafer Level Ball Grid Array) method. In this case, the underside of the RF chip 14 and the underside of the encapsulation material 40 can lie in a common plane, e.g. can be arranged in a coplanar fashion, on account of the manufacturing process.

Figure 6:
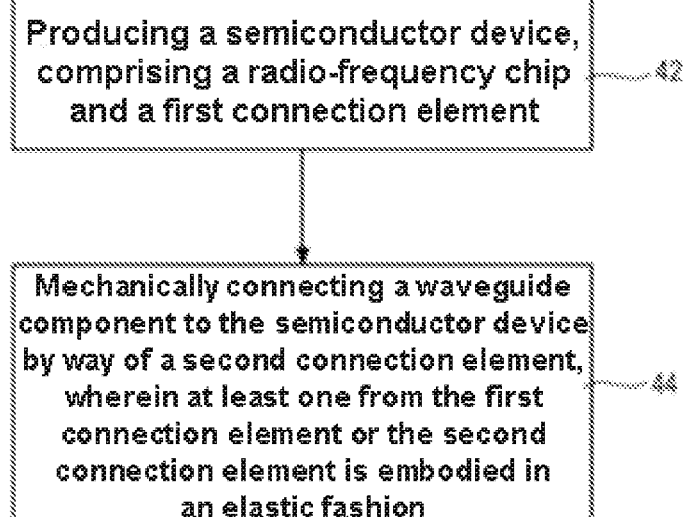
FIG. 6 shows a flow diagram of a method in accordance with the disclosure for manufacturing RF devices.

FIG. 6 shows a flow diagram of a method in accordance with the disclosure for manufacturing RF devices. The method can be used for example to manufacture the RF device from FIG. 1 and can thus be read in conjunction with FIG. 1. The method is presented generally in order to describe aspects of the disclosure qualitatively and can comprise further aspects. By way of example, the method can be extended by any of the aspects described in conjunction with FIG. 1.

In 42, a semiconductor device can be produced. The semiconductor device can comprise an RF chip and a first connection element, which is configured to mechanically and electrically connect the semiconductor device to a circuit board. In 44, a waveguide component can be mechanically connected to the semiconductor device by way of a second connection element, wherein the waveguide component can comprise a waveguide embodied in the waveguide component. At least one from the first connection element or the second connection element can be embodied in an elastic fashion.

Figure 7:
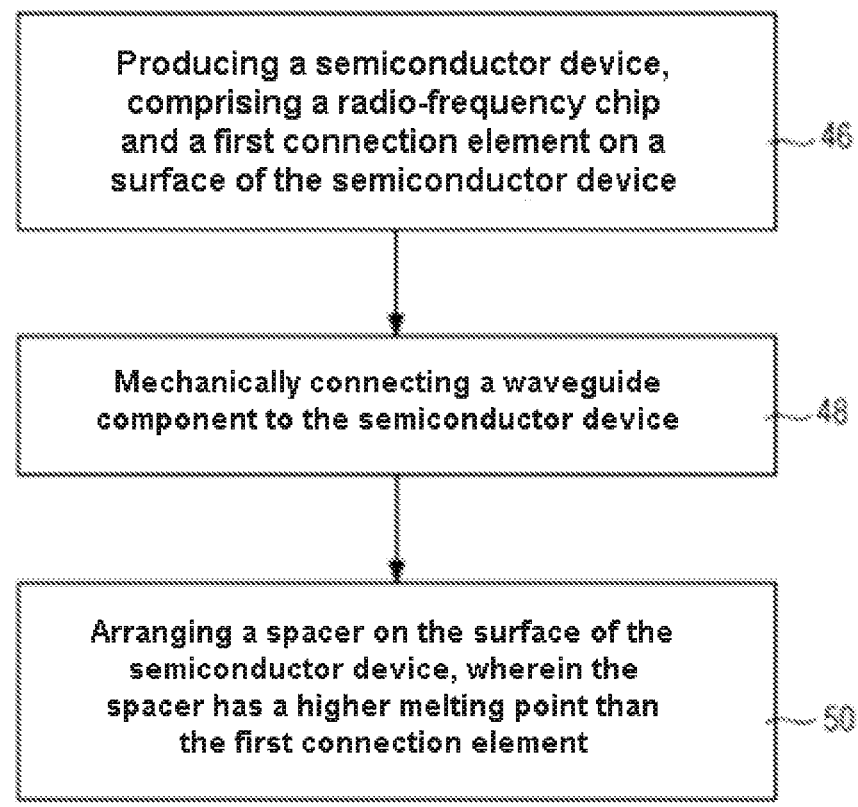
FIG. 7 shows a flow diagram of a method in accordance with the disclosure for manufacturing RF devices.

FIG. 7 shows a flow diagram of a method in accordance with the disclosure for manufacturing RF devices. The method can be used for example to manufacture the RF device from FIG. 2 and can thus be read in conjunction with FIG. 2. The method is presented generally in order to describe aspects of the disclosure qualitatively and can comprise further aspects. By way of example, the method can be extended by any of the aspects described in conjunction with FIG. 2.

In 46, a semiconductor device can be produced. The semiconductor device can comprise an RF chip and a first connection element on a surface of the semiconductor device, wherein the first connection element is configured to mechanically and electrically connect the semiconductor device to a circuit board. In 48, a waveguide component can be mechanically connected to the semiconductor device by way of a second connection element, wherein the waveguide component comprises a waveguide embodied in the waveguide component. In 50, a spacer can be arranged on the surface of the semiconductor device. The spacer can have a higher melting point than the first connection element. The spacer can be configured to provide a constant distance between the semiconductor device and a circuit board upon the semiconductor device being mechanically connected to the circuit board.

The method in FIG. 7 can be read in particular in conjunction with FIG. 2. Before the semiconductor device 2 is mechanically connected to the circuit board 12, the spacers 30 can be arranged on the underside of the substrate 4 or on the top side of the circuit board 12. In one example, the spacers 30 can in this case be mechanically connected to the respective component by way of an adhesion medium. In a further example, the spacers 30 can be positioned on the respective component without additional mechanical fixing. In a further action, the semiconductor device 2 and the circuit board 12 can be brought into mechanical contact with spacers 30 and first contact elements 10 arranged therebetween. In a further action, the temperature can be increased. By way of example, the first connection elements 10 can be solder balls, and the semiconductor device 2 can be soldered to the circuit board 12. An associated soldering profile can have a maximum temperature of approximately 260° C. At a temperature of approximately 220° C., the solder balls can melt, while the spacers 30 can maintain their solid state on account of a higher melting point. Using the spacers 30, a constant distance between the semiconductor device 2 and the circuit board 12 can thus be provided during the mechanical connection or the soldering action.

First connection elements 10 in the form of solder balls can have for example a diameter in a range of approximately 325 micrometers to approximately 350 micrometers before the soldering process. During the soldering process, the solder balls can liquefy and subsequently harden. A distance between the underside of the substrate 4 and the top side of the circuit board 12 can be in a range of approximately 200 micrometers to approximately 300 micrometers after hardening. This distance can correspond to a height of the spacers 30.

Figure 8:
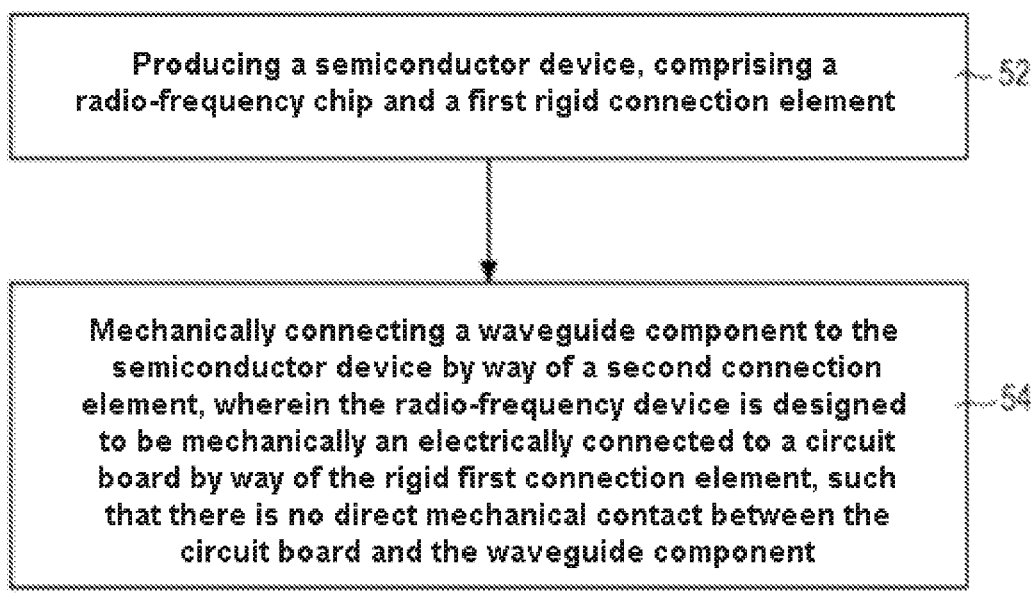
FIG. 8 shows a flow diagram of a method in accordance with the disclosure for manufacturing RF devices.

FIG. 8 shows a flow diagram of a method in accordance with the disclosure for manufacturing RF devices. The method can be used for example to manufacture the RF device from FIG. 3 and can thus be read in conjunction with FIG. 3. The method is presented generally in order to describe aspects of the disclosure qualitatively and can comprise further aspects. By way of example, the method can be extended by any of the aspects described in conjunction with FIG. 3.

In 52, a semiconductor device can be produced. The semiconductor device can comprise an RF chip and a rigid first connection element. In 54, a waveguide component can be mechanically connected to the semiconductor device by way of a second connection element, wherein the waveguide component can comprise a waveguide embodied in the waveguide component. The RF device can be configured to be mechanically and electrically connected to a circuit board by way of the rigid first connection element, such that there is no direct mechanical contact between the circuit board and the waveguide component.

Figure 9:
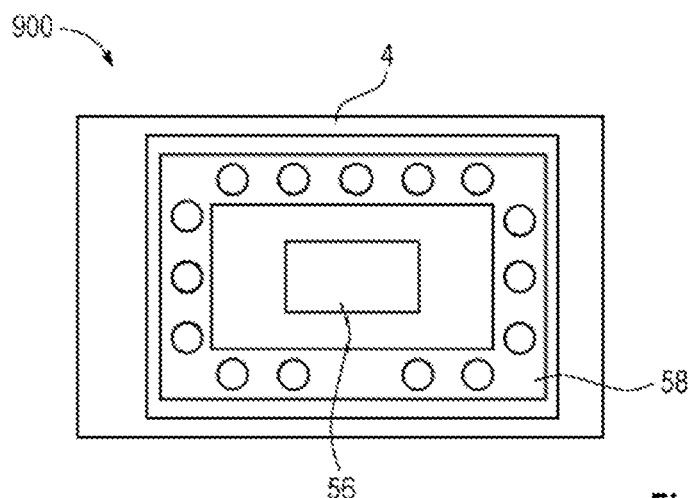
FIG. 9 schematically shows a plan view of a radiation element 900, such as can be contained in an RF device in accordance with the disclosure.

FIG. 9 schematically shows a plan view of a radiation element 900, such as can be contained in an RF device in accordance with the disclosure. By way of example, one or more of the radiation elements 16 from FIG. 1 can be embodied in a similar manner. As already described in FIG. 1, the radiation element 900 can be arranged on a substrate 4. The radiation element 900 can comprise a patch antenna 56, which can be surrounded by a ground structure 58. The patch antenna 56 can be embodied by a rectangular metal area, for example, and the ground structure 58 can extend in a rectangular frame shape around the patch antenna 56. The arrangement shown in FIG. 9 can be configured for example to radiate RF signals generated by an RF chip 14 and guided to the radiation element 900 into a waveguide in a suitable manner.

Figure 10:
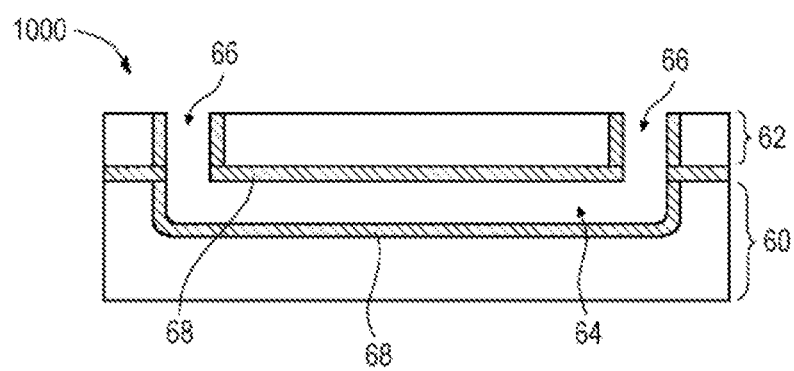
FIG. 10 schematically shows a cross-sectional side view of a multilayered injection-molded plastic 1000 with an integrated hollow waveguide.

FIG. 10 schematically shows a cross-sectional side view of a multilayered injection-molded plastic 1000 with an integrated hollow waveguide. By way of example, the waveguide component 20 from FIG. 1 can be embodied by a similar injection-molded plastic. The injection-molded plastic 1000 can comprise a first layer arrangement 60 and a second layer arrangement 62. Each of the layer arrangements 60 and 62 can comprise one or more layers, for example layers composed of a ceramic and/or dielectric material. The first layer arrangement 60 can have a horizontally extending cutout 64, while the second layer arrangement 62 can have through holes 66 extending vertically through the second layer arrangement 62. The layer arrangements 60 and 62 can be aligned with one another such that the cutout 64 and the through holes 66 form a channel extending continuously through the layer arrangements 60 and 62. The inner walls of the channel can be covered by a metallization 68 throughout. The channel with its metallized inner walls can thus form a hollow waveguide through the layer arrangements 60 and 62.

FIG. 10 illustrates by way of example a substantially horizontal course of a hollow waveguide through a multilayered injection-molded plastic 1000. In this case, only a part of the injection-molded plastic 1000 is illustrated. The injection-molded plastic 1000 can comprise an arbitrary number of further layer arrangements which can be structured and arranged one above another such that one or more hollow waveguides having an arbitrary combination of, in particular, horizontal and/or vertical sections can extend through the injection-molded plastic 1000. Through a suitable combination of horizontal and/or vertical sections, it is possible to realize an arbitrary course of the hollow waveguide(s) through the injection-molded plastic 1000.

EXAMPLES

RF devices comprising a semiconductor device and a waveguide component, and associated manufacturing methods, are explained below on the basis of examples.

Example 1 is a radio-frequency device, comprising: a semiconductor device, comprising: a radio-frequency chip, and a first connection element configured to mechanically and electrically connect the semiconductor device to a circuit board; and a waveguide component arranged over the semiconductor device, comprising: a waveguide embodied in the waveguide component, and a second connection element, which mechanically connects the waveguide component to the semiconductor device, wherein at least one from the first connection element or the second connection element is embodied in an elastic fashion.

Example 2 is a radio-frequency device according to example 1, wherein one from the first connection element or the second connection element is embodied in an elastic fashion, and the other connection element is embodied in a rigid fashion.

Example 3 is a radio-frequency device according to example 1 or 2, wherein the first connection element comprises an elastic plastic with electrically conductive filler particles.

Example 4 is a radio-frequency device according to any of the preceding examples, wherein the first connection element comprises one or more from an elastomer pin, an elastomer ball, a spring element, or a foam.

Example 5 is a radio-frequency device according to example 1 or 2, wherein the first connection element comprises one or more from a solder material, a metal, or a metal alloy.

Example 6 is a radio-frequency device according to any of the preceding examples, wherein the second connection element comprises one or more from an elastomer or a foam.

Example 7 is a radio-frequency device according to any of examples 1 to 5, wherein the second connection element comprises one or more from a solder material, a metal, a metal alloy, or an adhesive.

Example 8 is a radio-frequency device, comprising: a semiconductor device, comprising: a radio-frequency chip, and a first connection element configured to mechanically and electrically connect the semiconductor device to a circuit board; a waveguide component arranged over the semiconductor device, comprising: a waveguide embodied in the waveguide component, and a second connection element, which mechanically connects the waveguide component to the semiconductor device; and a spacer, wherein: the spacer has a higher melting point than the first connection element, the spacer and the first connection element are arranged on an identical surface of the semiconductor device, and the spacer is configured to provide a constant distance between the semiconductor device and a circuit board upon the semiconductor device being mechanically connected to the circuit board.

Example 9 is a radio-frequency device according to example 8, wherein the spacer comprises one or more from silicon, a plastic, or a mold compound.

Example 10 is a radio-frequency device according to any of the preceding examples, furthermore comprising: a circuit board, wherein the semiconductor device and the waveguide component are each directly mechanically connected to the circuit board.

Example 11 is a radio-frequency device according to any of the preceding examples, wherein the waveguide component extends over a surface of the semiconductor device facing the waveguide component and over side surfaces of the semiconductor device.

Example 12 is a radio-frequency device, comprising: a semiconductor device, comprising: a radio-frequency chip, and a rigid first connection element; and a waveguide component arranged over the semiconductor device, comprising: a waveguide embodied in the waveguide component, and a second connection element, which mechanically connects the waveguide component to the semiconductor device, wherein the rigid first connection element is configured to mechanically and electrically connect the radio-frequency device to a circuit board, such that there is no direct mechanical contact between the circuit board and the waveguide component.

Example 13 is a radio-frequency device according to any of the preceding examples, wherein the semiconductor device furthermore comprises: a radiation element configured for one or more from the following: radiating into the waveguide or receiving signals by way of the waveguide.

Example 14 is a radio-frequency device according to any of the preceding examples, wherein the waveguide component is embodied in an injection-molded plastic and the waveguide comprises a metallized hollow waveguide embodied in the injection-molded plastic.

Example 15 is a radio-frequency device according to any of the preceding examples, wherein the waveguide comprises one or more from an air-filled hollow waveguide or a dielectric waveguide.

Example 16 is a radio-frequency device according to any of the preceding examples, wherein the semiconductor device furthermore comprises: an encapsulation material, wherein the radio-frequency chip is at least partly encapsulated by the encapsulation material, wherein a surface of the encapsulation material and a surface of the radio-frequency chip lie in one plane.

Example 17 is a radio-frequency device according to any of examples 1 to 15, wherein the semiconductor device furthermore comprises: a substrate, wherein the first connection element and the radio-frequency chip are arranged on an identical surface of the substrate, and wherein the radio-frequency chip is mounted on the surface of the substrate using a flip-chip technique.

Example 18 is a method for manufacturing a radio-frequency device, wherein the method comprises: producing a semiconductor device, comprising: a radio-frequency chip, and a first connection element, which is configured to mechanically and electrically connect the semiconductor device to a circuit board; and mechanically connecting a waveguide component to the semiconductor device using a second connection element, wherein the waveguide component comprises a waveguide embodied in the waveguide component, wherein at least one from the first connection element or the second connection element is embodied in an elastic fashion.

Example 19 is a method for manufacturing a radio-frequency device, wherein the method comprises: producing a semiconductor device, comprising: a radio-frequency chip, and a first connection element on a surface of the semiconductor device, wherein the first connection element is configured to mechanically and electrically connect the semiconductor device to a circuit board; mechanically connecting a waveguide component to the semiconductor device using a second connection element, wherein the waveguide component comprises a waveguide embodied in the waveguide component; and arranging a spacer on the surface of the semiconductor device, wherein: the spacer has a higher melting point than the first connection element, and the spacer is configured to provide a constant distance between the semiconductor device and a circuit board upon the semiconductor device being mechanically connected to the circuit board.

Example 20 is a method according to example 18 or 19, furthermore comprising: before connecting the waveguide component to the semiconductor device: aligning the waveguide component with the semiconductor device using one or more from an optical alignment structure or a mechanical alignment structure.

Within the meaning of the present description, the terms "connected", "coupled", "electrically connected" and/or "electrically coupled" need not necessarily mean that components must be directly connected or coupled to one another. Intervening components can be present between the "connected", "coupled", "electrically connected" or "electrically coupled" components.

Furthermore, the words "over" and "on" used for example with respect to a material layer that is formed "over" or "on" a surface of an object or is situated "over" or "on" the surface can be used in the present description in the sense that the material layer is arranged (for example formed, deposited, etc.) "directly on", for example in direct contact with, the surface meant. The words "over" and "on" used for example with respect to a material layer that is formed or arranged "over" or "on" a surface can also be used in the present text in the sense that the material layer is arranged (e.g. formed, deposited, etc.) "indirectly on" the surface meant, wherein for example one or more additional layers are situated between the surface meant and the material layer.

Insofar as the terms "have", "contain", "encompass", "with" or variants thereof are used either in the detailed description or the claims, these terms are intended to be inclusive in a similar manner to the term "comprise". That means that within the meaning of the present description the terms "have", "contain", "encompass", "with", "comprise" and the like are open terms which indicate the presence of stated elements or features but do not exclude further elements or features. The articles "a/an" or "the" should be understood such that they include the plural meaning and also the singular meaning, unless the context clearly suggests a different understanding.

Furthermore, the word "exemplary" is used in the present text in the sense that it serves as an example, a case or an illustration. An aspect or a configuration that is described as "exemplary" in the present text should not necessarily be understood in the sense as though it has advantages over other aspects or configurations. Rather, the use of the word "exemplary" is intended to present concepts in a concrete manner. Within the meaning of this application, the term "or" does not mean an exclusive "or", but rather an inclusive "or". That is to say that, unless indicated otherwise or unless a different interpretation is allowed by the context, "X uses A or B" means each of the natural inclusive permutations. That is to say that if X uses A, X uses B or X uses both A and B, then "X uses A or B" is fulfilled in each of the cases mentioned above. Moreover, the articles "a/an" can be interpreted within the meaning of this application and the accompanying claims generally as "one or more", unless it is expressly stated or clearly evident from the context that only a singular is meant. Furthermore, at least one from A or B or the like generally means A or B or both A and B.

Devices and methods for manufacturing devices are described in the present description. Observations made in connection with a device described can also apply to a corresponding method, and vice versa. If a specific component of a device is described, for example, then a corresponding method for manufacturing the device can contain an action for providing the component in a suitable manner, even if such an action is not explicitly described or illustrated in the figures. Moreover, the features of the various example aspects described in the present text can be combined with one another, unless expressly noted otherwise.

Although the disclosure has been shown and described with respect to one or more implementations, equivalent alterations and modifications based at least in part on the reading and understanding of this description and the accompanying drawings will be apparent to the person skilled in the art. The disclosure includes all such modifications and alterations and is restricted solely by the concept of the following claims. Especially with respect to the various functions that are implemented by the above-described components (for example elements, resources, etc.), the intention is that, unless indicated otherwise, the terms used for describing such components correspond to any components which implement the specified function of the described component (which is functionally equivalent, for example), even if it is not structurally equivalent to the disclosed structure which implements the function of the example implementations of the disclosure presented herein. Furthermore, even if a specific feature of the disclosure has been disclosed with respect to only one of various implementations, such a feature can be combined with one or more other features of the other implementations in a manner such as is desired and advantageous for a given or specific application.

The invention claimed is:

1. A radio-frequency device, comprising:
 a semiconductor device, comprising:
  a radio-frequency chip, and
  a first connection element, which is arranged over a first surface of the semiconductor device and configured to mechanically and electrically connect the semiconductor device to a circuit board; and
 a waveguide component arranged over the semiconductor device, comprising:
  a waveguide embodied in the waveguide component, and
  a second connection element, which is arranged over a second surface of the semiconductor device situated opposite the first surface and which mechanically connects the waveguide component to the semiconductor device,
 wherein at least one of the first connection element or the second connection element is an elastic connection element.

2. The radio-frequency device as claimed in claim 1, wherein the one of the first connection element or the second connection element is the elastic connection element, and another one of the first connection element or the second connection element is a rigid connection element.

3. The radio-frequency device as claimed in claim 1, wherein the first connection element comprises an elastic plastic with electrically conductive filler particles.

4. The radio-frequency device as claimed in claim 1, wherein the first connection element comprises one or more of an elastomer pin, an elastomer ball, a spring element, or a foam.

5. The radio-frequency device as claimed in claim 1, wherein the first connection element comprises one or more of a solder material, a metal, or a metal alloy.

6. The radio-frequency device as claimed in claim 1, wherein the second connection element comprises one or more of an elastomer or a foam.

7. The radio-frequency device as claimed in claim 1, wherein the second connection element comprises one or more of a solder material, a metal, a metal alloy, or an adhesive.

8. The radio-frequency device as claimed in claim 1, further comprising:
the circuit board, wherein the semiconductor device and the waveguide component are each directly mechanically connected to the circuit board.

9. The radio-frequency device as claimed in claim 1, wherein the waveguide component extends over a surface of the semiconductor device facing the waveguide component and over side surfaces of the semiconductor device.

10. The radio-frequency device as claimed in claim 1, wherein the semiconductor device further comprises:
a radiation element configured for one or more of: radiating into the waveguide or receiving signals by way of the waveguide.

11. The radio-frequency device as claimed in claim 1, wherein the waveguide component is embodied in an injection-molded plastic and the waveguide comprises a metallized hollow waveguide embodied in the injection-molded plastic.

12. The radio-frequency device as claimed in claim 1, wherein the waveguide comprises one or more of an air-filled hollow waveguide or a dielectric waveguide.

13. The radio-frequency device as claimed in claim 1, wherein the semiconductor device further comprises:
an encapsulation material, wherein the radio-frequency chip is at least partly encapsulated by the encapsulation material, wherein a surface of the encapsulation material and a surface of the radio-frequency chip lie in one plane.

14. The radio-frequency device as claimed in claim 1, wherein the semiconductor device further comprises:
a substrate, wherein the first connection element and the radio-frequency chip are arranged on an identical surface of the substrate, and wherein the radio-frequency chip is mounted on the identical surface of the substrate using a flip-chip technique.

15. A radio-frequency device, comprising:
a semiconductor device, comprising:
a radio-frequency chip, and
a first connection element, which is arranged over a first surface of the semiconductor device and configured to mechanically and electrically connect the semiconductor device to a circuit board;
a waveguide component arranged over the semiconductor device, comprising:
a waveguide embodied in the waveguide component, and
a second connection element, which is arranged over a second surface of the semiconductor device situated opposite the first surface and which mechanically connects the waveguide component to the semiconductor device; and
a spacer, wherein:
the spacer has a higher melting point than the first connection element,
the spacer and the first connection element are arranged on an identical surface of the semiconductor device, and
the spacer is configured to provide a constant distance between the semiconductor device and the circuit board upon the semiconductor device being mechanically connected to the circuit board.

16. The radio-frequency device as claimed in claim 15, wherein the spacer comprises one or more of silicon, a plastic, or a mold compound.

17. A radio-frequency device, comprising:
a semiconductor device, comprising:
a radio-frequency chip, and
a rigid first connection element arranged over a first surface of the semiconductor device; and
a waveguide component arranged over the semiconductor device, comprising:
a waveguide embodied in the waveguide component, and
a second connection element, which is arranged over a second surface of the semiconductor device situated opposite the first surface and which mechanically connects the waveguide component to the semiconductor device,
wherein the rigid first connection element is configured to mechanically and electrically connect the radio-frequency device to a circuit board, wherein the rigid first connection element is arranged such that there is no direct mechanical contact between the circuit board and the waveguide component.

18. A method for manufacturing a radio-frequency device, wherein the method comprises:
producing a semiconductor device, comprising:
a radio-frequency chip, and
a first connection element, which is arranged over a first surface of the semiconductor device and which is configured to mechanically and electrically connect the semiconductor device to a circuit board; and
mechanically connecting a waveguide component to the semiconductor device using a second connection element arranged over a second surface of the semiconductor device situated opposite the first surface, wherein the waveguide component comprises a waveguide embodied in the waveguide component,
wherein at least one from the first connection element or the second connection element is an elastic connection element.

19. The method as claimed in claim 18, further comprising:
before connecting the waveguide component to the semiconductor device: aligning the waveguide component with the semiconductor device using one or more from an optical alignment structure or a mechanical alignment structure.

20. A method for manufacturing a radio-frequency device, wherein the method comprises:
producing a semiconductor device, comprising:
a radio-frequency chip, and
a first connection element arranged over a first surface of the semiconductor device, wherein the first connection element is configured to mechanically and electrically connect the semiconductor device to a circuit board;
mechanically connecting a waveguide component to the semiconductor device using a second connection element arranged over a second surface of the semiconductor device situated opposite the first surface, wherein the waveguide component comprises a waveguide embodied in the waveguide component; and
arranging a spacer on the first surface of the semiconductor device, wherein:

the spacer has a higher melting point than the first connection element, and the spacer is configured to provide a constant distance between the semiconductor device and a circuit board upon the semiconductor device being mechanically connected to the circuit board.

\* \* \* \* \*